United States Patent [19]
DaSilva et al.

[11] Patent Number: 5,644,260
[45] Date of Patent: Jul. 1, 1997

[54] RC/CR AUTOMATIC QUADRATURE NETWORK

[75] Inventors: Marcus K. DaSilva, Newman Lake, Wash.; Andrew M. Teetzel, Healdsburg, Calif.

[73] Assignee: Hewlett-Packard Company, Palo Alto, Calif.

[21] Appl. No.: 542,745

[22] Filed: Oct. 13, 1995

Related U.S. Application Data

[63] Continuation of Ser. No. 425,325, Apr. 17, 1995, abandoned, which is a continuation of Ser. No. 125,380, Sep. 22, 1993, abandoned.

[51] Int. Cl.$^6$ .................................. H03H 7/20; H03H 7/21
[52] U.S. Cl. ....................... 327/238; 327/240; 327/243; 333/18; 333/139; 332/103
[58] Field of Search .................................. 333/2, 18, 124, 333/139; 307/511, 512, 262; 328/55, 155; 332/103; 327/238, 240, 243

[56] References Cited

U.S. PATENT DOCUMENTS

| | | | |
|---|---|---|---|
| 4,908,532 | 3/1990 | Chadwick | 307/512 |
| 4,951,000 | 8/1990 | Dautriche | 328/155 |

*Primary Examiner*—Siegfried H. Grimm
*Attorney, Agent, or Firm*—Edward L. Miller

[57] ABSTRACT

An IQ modulator incorporates a quadrature network that is responsive to a frequency dependent control signal and that has in-phase and quadrature signals that are of equal amplitude and in exact quadrature over a wide range of applied frequencies. The quadrature network includes RC and CR phase shifters whose C's are fixed capacitors of equal value and whose R's are made equal to each other and to the capacitive reactance of the C's by the action of the frequency dependent control signal. The R's may be FET's. The frequency dependent control signal may be generated without express knowledge of the applied frequency by a servo loop that nulls out the amplitude difference between the in-phase and quadrature outputs from the quadrature network; it may also be generated from a look-up table as an express function of frequency. The frequency dependent control signal is split into separate instances that are applied to each R, and an offset may be introduced therebetween to provide extreme precision. The offset may be fixed or programmatically controlled as a function of frequency. Varactors may be used to provide variable C's in cooperation with fixed R's. The entire circuit may be fabricated as a GaAs IC for use in the frequency range of 200 MHz to 3 GHz.

7 Claims, 16 Drawing Sheets

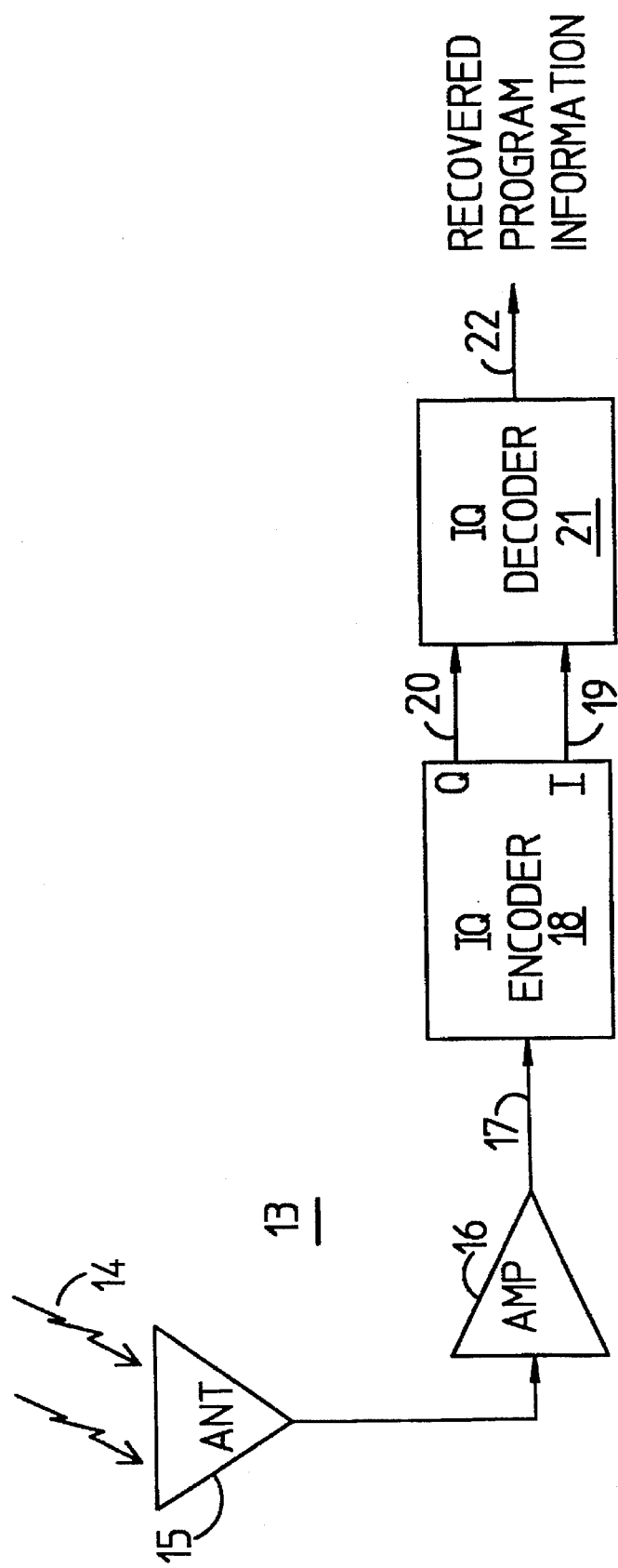

RC/CR AUTOMATIC QUADRATURE NETWORK

CROSS REFERENCE TO RELATED APPLICATIONS

This application is a continuation of application Ser. No. 08/425,325 entitled RC/CR AUTOMATIC QUADRATURE NETWORK and filed on 17 Apr. 1995 by Marcus K. DaSilva and Andrew M. Teetzel, now abandoned, which in turn was a continuation of a original parent application Ser. No. 08/125,380 entitled WIDEBAND IQ MODULATOR WITH RC/CR AUTOMATIC QUADRATURE NETWORK and filed on 22 Sep. 1993 by Marcus K. DaSilva and Andrew M. Teetzel, now abandoned.

BACKGROUND OF THE INVENTION

IQ modulation is a very general form of modulating an RF carrier to convey program information. After IQ modulation both the amplitude and phase of the modulated carrier can convey recoverable information. Although IQ modulation is sufficiently general to produce conventional analog AM and conventional analog FM modulation, it is most often used in digital settings where the program information is in digital form to start with, or if originally analog, has been digitized. For an introduction to IQ modulation in digital settings, see an article entitled An *Instrument for Testing North American Digital Cellular Radios* published in the April 1991 HEWLETT-PACKARD JOURNAL, pages 65–72.

FIG. 1A is a simplified block diagram of a portion of a prior art communications system incorporating an IQ modulator. As shown in that figure, program information 2 that may be in either analog form or digital form (i.e., either analog or digital electrical signals) is applied to an IQ encoder 3. Its purpose is to translate, or convert by mapping and/or encoding, the format of the program information 2 into a pair of signals I (4) and Q (5). In the case where the program information 2 is an analog signal $V_{in}$, then signals I (4) and Q (5) would actually vary continuously as analog signals, also. That variation would typically be in accordance with some functions F and G, such that $I=F(V_{in})$ and $Q=G(V_{in})$, rather than a simple $I=V_{in}$ or $Q=V_{in}$, although that is possible. In the case where the program information is digital, the resulting actual voltage values for I and Q are restricted to discrete possibilities. Transitions between these possibilities are in principle abrupt, and if left untreated produce unwanted and deleterious effects in the modulated signal. It is therefore usual to constrain these abrupt changes in I and Q by filtering them before they are used.

It is quite a common circumstance for the program information 2 to be in digital form. Perhaps the program information never existed in analog form at all, and was always just so many bits in the first instance; or perhaps it is a digitized representation of some analog phenomenon, say, speech. In these digital cases, it is common to group the incoming data stream into groups of, say, n bits. There are $2_n$ different possible combinations that those n bits might have. Then what the IQ encoder 3 does is produce voltage values for I and Q that, as a combination, correspond to one of the $2^n$ many combinations of the group. Typically, n is even, and each of the signals I 4 and Q 5 can independently assume $2^{(n/2)}$ different states or voltage values, for a total of $2^n$ combinations of I and Q taken together.

The signals I 4 and Q 5 are applied to an IQ modulator 6 that also receives an RF signal 8 produced by a local oscillator 7. The IQ modulator 6 operates upon the RF signal 8 to produce a modulated RF signal 9 whose amplitude and phase may each convey information. This signal 9 is typically amplified by an amplifier 10 to produce a transmittable signal. In the example of FIG. 1A that signal is applied to an antenna 11 to produce a radiating modulated signal 12.

For the sake of completeness, we shall touch briefly on the corresponding IQ receiver 13 shown in FIG. 1B. Typically, a radiated IQ modulated signal 14 (corresponding to radiating signal 12 in FIG. 1A) produces in an antenna 15 a corresponding electrical signal that is then amplified by an amplifier 16. The amplifier 16 produces a high level IQ signal 17 suitable for application to an IQ demodulator 18. In digital systems IQ demodulator 18 typically cooperates with a clock recovery capability and perhaps also an LO recovery circuit. In any receiver IQ demodulator 18 produces signals I 19 and Q 20 that correspond to earlier I and Q signals (4, 5) in IQ transmitter 1. These recovered I and Q signals 19 and 20 could, in a digital system, be strobed by the recovered clock signal (not shown). In more sophisticated systems, the nature of the IQ transitions produced by the filter in the IQ modulator are incorporated into a digital signal processing network that selects or predicts the most probably correct new values of I and Q, based on their recent prior history. An IQ decoder 21 translates the demodulated IQ combinations back into the original format for the program information. This re-translation appears as recovered program information 22.

As will become evident as we proceed, phase shift networks are used within the IQ modulator 6 (as well as within the IQ demodulator 18). These networks are used to split a single signal, such as the RF signal 8 from local oscillator 7, into a pair of signals that are in exact quadrature (i.e., exhibit between themselves a phase difference of ninety degrees). What is more, it is also quite desirable that the signals in quadrature also be of nearly equal amplitude, since amplitude variations can be translated into apparent phase variations by subsequent circuitry. As the data rate (bandwidth) increases the number of IQ states used also increases, meaning that there is a less pronounced difference between those states. The accuracies of the IQ modulating and IQ demodulating processes depend heavily upon accurate determination of phase. And while these requirements can be met for any particular local oscillator frequency, or for a narrow range of local oscillator frequencies, it is quite something else to meet them with an IQ modulator or IQ demodulator intended for use with a local oscillator input signal that is allowed to vary over a wide range, say, 200 MHz to over 3 GHz.

In support of this, consider the simplified block diagram of a prior art IQ modulator 23 shown in FIG. 2. An RF input signal (24, 8) serves as the signal to be modulated, and is applied to a quadrature network 25. The output of the quadrature network 25 is two signals $LO_i$ 26 and $LO_q$ 27 that are of the same frequency as the RF signal input (24, 8) but are in quadrature. These signals are applied to multipliers 28 and 29, respectively. Each of these multipliers also receives its associated I or Q input signals, denoted in the figure as $I_{in}$ (30, 4) and $Q_{in}$ (31, 5), respectively. Multipliers 28 and 29 may comprise double balanced mixers, various types of switching networks, or actual (analog or digital) multiplier circuits. The outputs 32 and 33 of the multipliers 28 and 29 are then summed in a summer 34 to produce an output signal (35, 9) that is the IQ modulated signal.

Frequency dependent amplitude variations are inherent in the reactive phase shifters used internally within the quadrature network. Limiting amplifiers are typically used to restore the phase shifted signals to a selected constant amplitude. As the signal being shifted varies in frequency the degree of limiting experienced by the limiting amplifiers varies, since the amplitude of their input signal varies accordingly. The net result is an unwanted change in the resulting phase shift in the signal as finally amplified. The amount of the unwanted phase shift will be related to the amount of amplification needed to produce limiting. But correct quadrature is essential for proper IQ modulator operation. It is because of this that conventional IQ modulators must be "tweaked" to operate at any particular frequency. But a modulator that must be tweaked is not a broadband device suitable for straightforward use over a wide range of frequencies.

This, then, is the problem: A wideband IQ modulator (or demodulator) requires accurate phase shifting of a signal to produce two signals $LO_i$ and $LO_q$ that are precisely ninety degrees apart (i.e., in quadrature). Many reactive phase shift networks disturb amplitude as they shift phase. The disturbance is a function of frequency. Signal amplitude can be subsequently restored, but at the expense of introducing some additional (and generally unknown) amount of phase shift. Since any particular mixer tends to work best over a limited range of applied power, amplitude restoration is generally necessary. This means that the $LO_i$ and $LO_q$ signals in an IQ modulator (or their LO counterparts in an IQ demodulator) will not be in exact quadrature as the frequency of operation is varied away from some optimum value. This limits the performance of the IQ modulation scheme in use, unless operation is at that optimum frequency.

Another view of the same problem is the observation that it would be desirable if a reactive phase shift network were free of amplitude variations despite variations in applied frequency. If such were available then a quadrature network and its companion amplifiers could produce exact quadrature over a broad range of applied frequencies. That would in turn allow a single part to serve in a wide variety of different applications, and allow for considerably simplified schemes for wide frequency range applications where the output of a single frequency IQ modulator must otherwise be mixed with swept or variable frequency sources.

SUMMARY OF THE INVENTION

A solution to the wideband precision quadrature problem is a quadrature network responsive to a frequency dependent control signal. Such a quadrature network may include reactive phase shifters that are in parallel between ground and an applied signal, and that are each responsive to the frequency dependent control signal. Each such phase shifter includes an R and a C that are in series. An RC phase shifter is driven at one end of the R, one end of the C is grounded, and the phase shifted output is available at the junction of the R and the C. A CR phase shifter is driven at one end of the C, one end of the R is grounded, and its output is available at the junction of the C and the R. In a preferred embodiment the C's are of fixed and equal value. The R's are FET's connected to the frequency dependent control signal so that their resistances are identical functions thereof. By varying the frequency dependent control signal the ohmic value of the R's is made to equal each other as well as the capacitive reactance ($X_c$) of each C. This ensures that the two outputs ($LO_i$ and $LO_q$) are exactly in quadrature and have equal amplitudes.

The frequency dependent control signal may be produced by a "dead reckoning" approach using a knowledge of the applied frequency; for example, a DAC could be driven by a value provided from a look-up table addressed by frequency. A preferred technique, however, takes advantage of the fact that for equal C's, if $LO_i$ does not equal $LO_q$, then the ohmic value of the R's no longer equals $X_c$, (and hence $LO_i$ and $LO_q$ are not in quadrature, either). The R's can be set back to equal $X_c$ automatically, however, by forming the amplitude difference between $LO_i$ and $LO_q$, amplifying it and using that as the frequency dependent control signal. This forms a servo loop that automatically nulls the amplitude difference, and thus phase error from quadrature, also. Note that this technique does not use or otherwise require the frequency as an explicit input variable to the control loop. What is required is that the R's have the range to track $X_c$, and that they do so in unison as identical functions of the control signal.

A welcome advantage of this technique is that the levels of $LO_i$ and $LO_q$ now tend to remain fixed at about 70% (1/$\sqrt{2}$) of the applied local oscillator input, which means that the leveling amplifiers now need only accommodate changes produced by variations in the level of the input signal being put into quadrature.

Any actual implementation includes error mechanisms. Certain deviations from ideal behavior in the wideband RC/CR automatic quadrature network may be compensated by introducing a slight offset between the frequency dependent control signals supplied to the phase shifters. The offset may be fixed (best overall fit) or be a function of frequency (derived from a DAC driven from a look-up table).

An alternate embodiment uses fixed R's and varactors as variable C's. In this case the $X_c$'s are servoed to keep them equal to the R's.

In a preferred embodiment the mixers used are unbiased rings of MESFET's to eliminate upconversion of 1/f noise. The entire circuit of phase shifters and mixers is implemented as a GaAs IC to produce a range of operation of from below about 200 MHz to above 3 GHz.

BRIEF DESCRIPTION OF THE DRAWINGS

FIGS. 1A–B are a simplified and generalized block diagram of a conventional communication system incorporating a conventional IQ modulator;

DESCRIPTION OF A PREFERRED EMBODIMENT

Figure 1A:
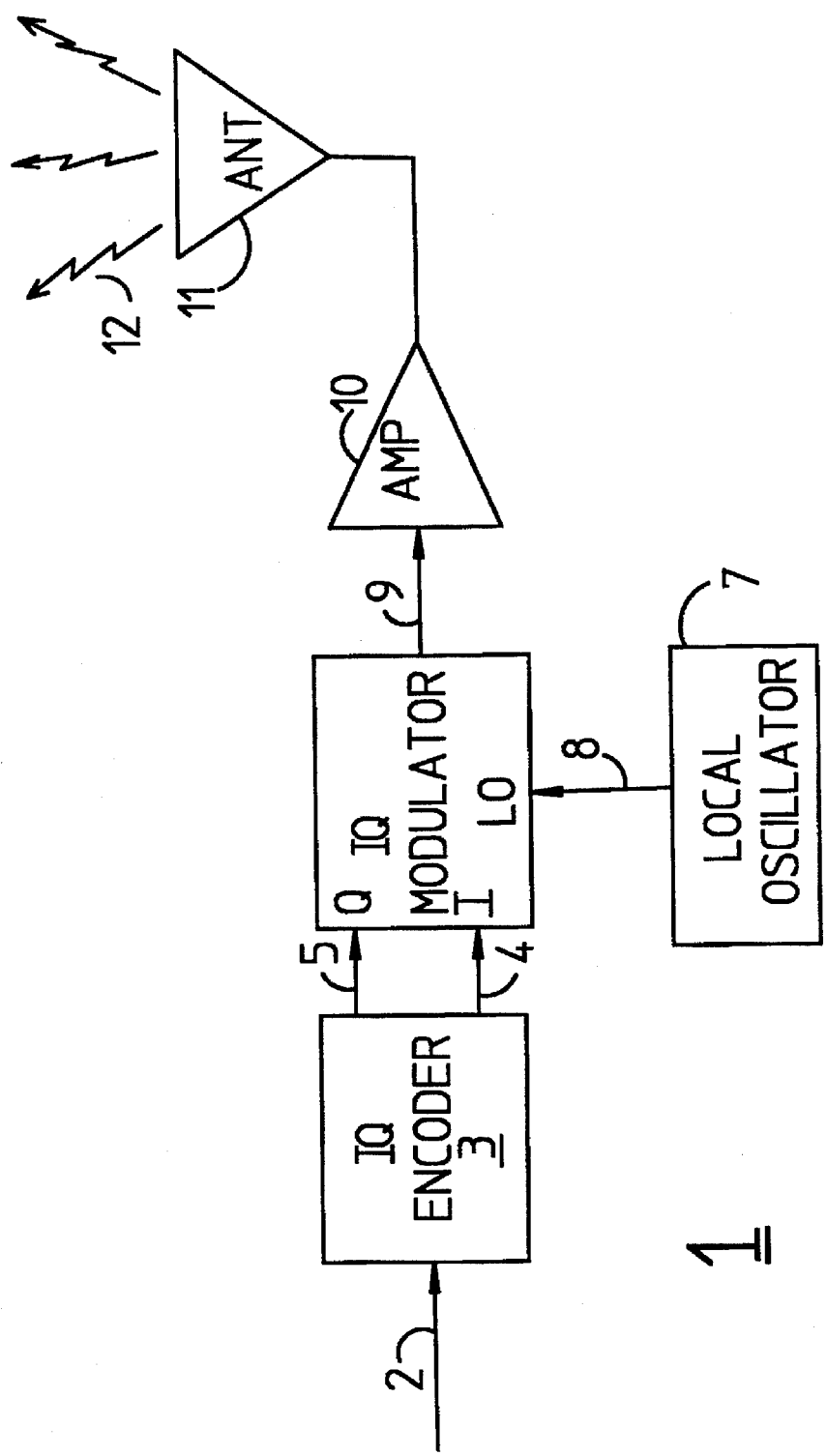
Figure 2:
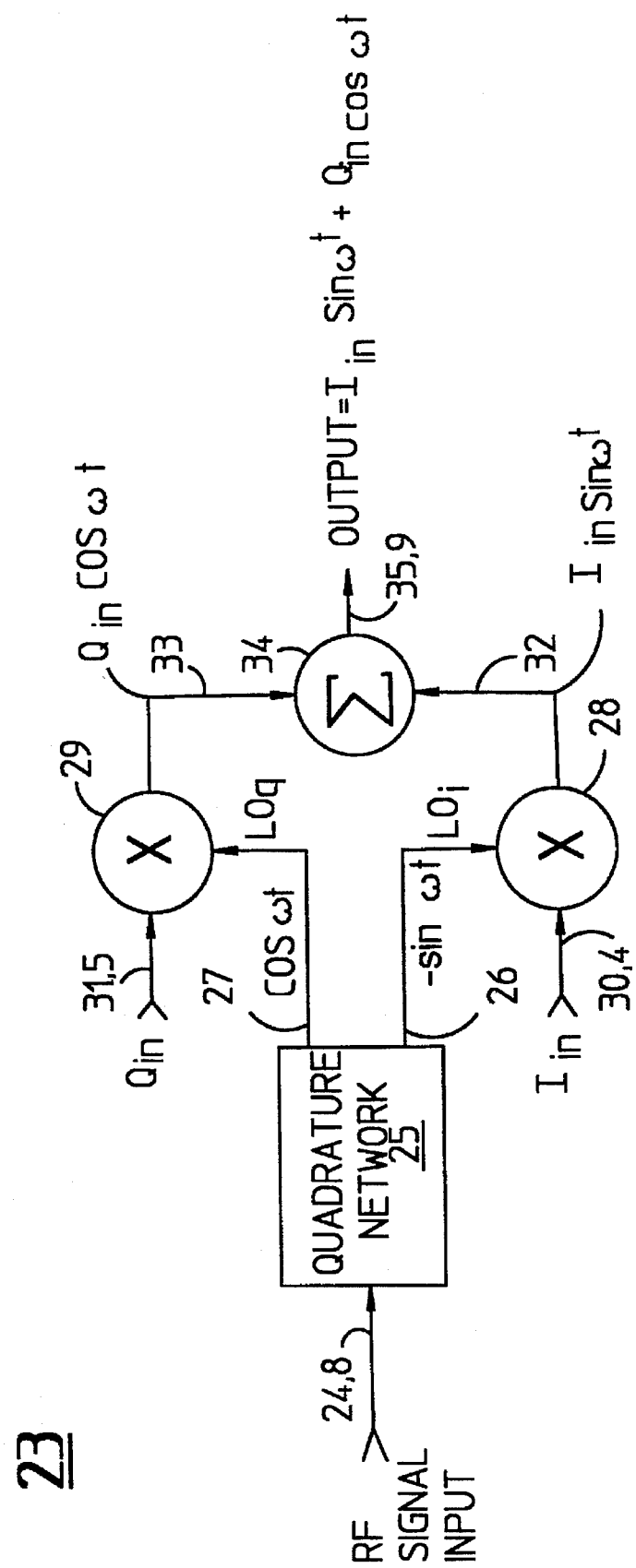
FIG. 2 is a simplified block diagram of a conventional IQ modulator.
Figure 3:
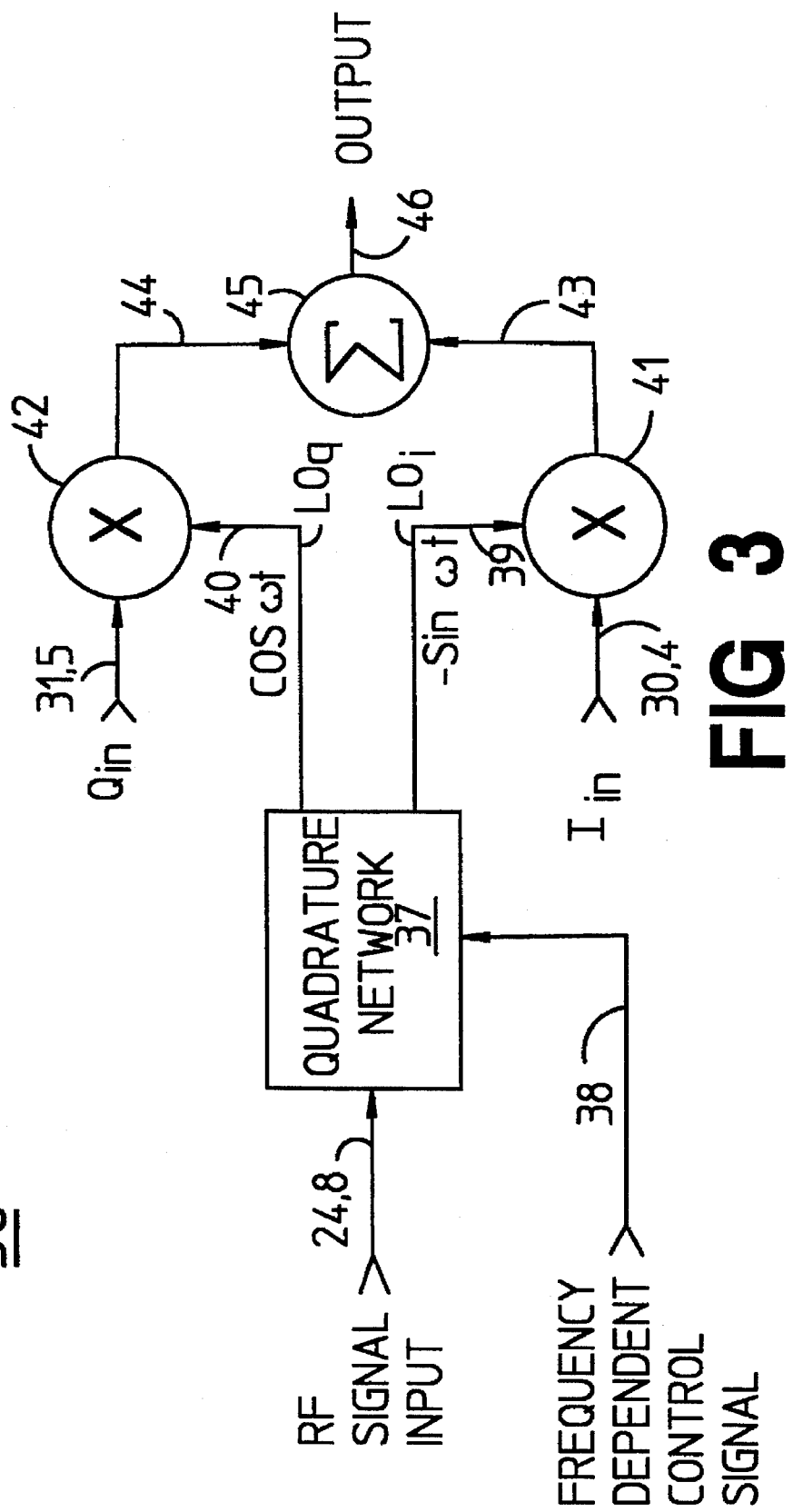
FIG. 3 is a generalized block diagram of an improved IQ modulator that incorporates a precision phase shifter operable over a very wide range of RF input frequencies.

Refer now to FIG. 3, wherein is shown a simplified and generalized block diagram of an IQ modulator 36 constructed in accordance with the principles of the invention. An RF input signal (24, 8) serves as the signal to be modulated, and is applied to an improved quadrature network 37 that is responsive to a frequency dependent control signal 38. The output of the quadrature network 37 is two signals $LO_i$ 39 and $LO_q$ 40 that are equal in amplitude, of the same frequency as the RF signal input (24, 8), but that are in quadrature. These signals 39 and 40 are applied to multipliers 41 and 42, respectively. Each of these multipliers also receives its associated I or Q input signals, denoted in the figure as $I_{in}$ (30, 4) and $Q_{in}$ (31, 5), respectively. The outputs 43 and 44 of the multipliers 41 and 42 are then summed in a summer 45 to produce an output signal 46 that is the IQ modulated signal.

Frequency dependent control signal 38 can take a variety of forms. It could be made up of one or more analog signals, a serially transmitted digital signal, or a digital control word presented in parallel. Its origin could be a circuit or unit that actually measures the frequency of the signal to be modulated. Alternatively, the output of the circuit or device that specifies the frequency value can be supplied to both the frequency source and the quadrature network. It is also possible that the frequency source is controlled in one fashion while it collaterally supplies to the quadrature network a separate indication of what frequency it is producing. Included among these possibilities is the use of look-up tables in a memory to convert frequency values expressed as digits to other digits that are subsequently converted by DAC's (Digital-to-Analog Converters) to analog control voltages, to which active elements in the quadrature network 38 can respond.

According to another possibility it is unnecessary to explicitly know or determine the frequency at which the IQ modulator is operating. This possibility is quite desirable, as it eliminates the bothersome need to actually know the frequency of operation. "Something" must take the place of that piece of information, however, so that the frequency dependent control signal 38 can be produced therefrom. We shall explain how a phase shift versus amplitude relationship for certain phase shifters within the quadrature network 37 can be used to produce amplitude level signals whose difference can be a servo loop control signal that functions as the frequency dependent control signal 38. With this arrangement the frequency of IQ modulator operation can be varied at will, with the only principal limitations being certain (widely spaced) upper and lower input frequency extremes and the response time of the servo loop. An actual implementation constructed in accordance with the teachings herein operates from below 200 MHz to above 3 GHz. Settling times of a few tens of microseconds can be expected for major frequency changes.

Figure 4:
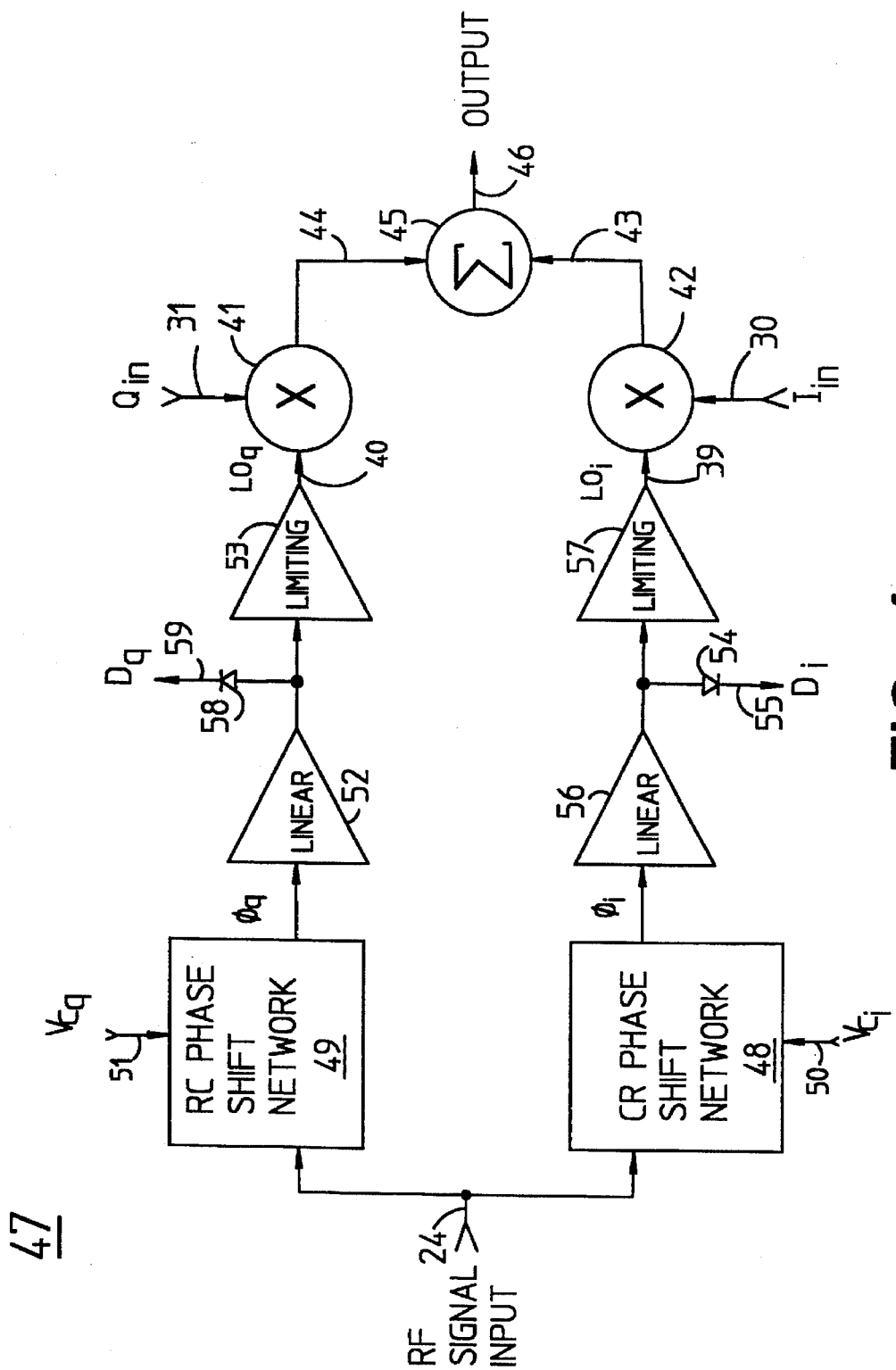
FIG. 4 is simplified block diagram of an IQ modulator constructed in the manner shown in FIG. 3.

Refer now to FIG. 4, wherein is shown a more detailed block diagram 47 of a quadrature network (such as 37 in FIG. 3) for use in an IQ modulator (such as 36 of FIG. 3). Any elements in the range 30–46 in FIG. 4 correspond directly to those of the same number in FIG. 3, and need not be described a second time. In FIG. 4, quadrature network 37 of FIG. 3 has been replaced by elements 48–59. It is to these new elements that we now turn.

Note that the RF input signal 24 is split in two and applied to a CR phase shift network 48 as well as to an RC phase shift network 49. Each of these phase shift networks is responsive to a respective analog control signal; these are $Vc_i$ 50 for CR phase shifter 48 and $Vc_q$ 51 for RC phase shifter 49. Discussions of how the control signals 50 and 51 originate, and of how they alter the internal operation of their respective phase shifters 48 and 49, are offered below.

For now, it is sufficient to appreciate that each control signal causes an amplitude change in the signal produced by its associated phase shifter, and that (given a constant input level for RF input signal 24) the output amplitude response from each shifter is a well defined and known-in-advance particular function of frequency. Each phase shifter has its own function, and they are related to each other and their output phase difference in the following way: independent of frequency and output amplitude, the phase difference between those output signals is exactly ninety degrees. This allows the output amplitudes to be adjusted until they are equal, without disturbing the phase difference. Equality will always produce a particular percentage of the applied input signal, so that if the input amplitude is held constant, the signals in quadrature will be of constant amplitude, as well.

This is most desirable, because it allows the subsequent amplifiers in each leg, or channel, to operate under the same conditions. The idea is that identical amplifiers operating under identical signal levels will not disturb the phase difference.

Each phase shifter drives a pair of cascaded amplifiers; the first amplifier in each pair is a linear amplifier, while the second amplifier in each pair is a limiting amplifier. RC phase shifter 49 drives amplifiers 52 (linear) and 53 (limiting), while CR phase shifter 48 drives amplifiers 56 (linear) and 57 (limiting). Note also that each signal path incorporates level detection: the output of amplifier 52 is coupled to level detector 58, and the output of amplifier 56 is coupled to level detector 54. The outputs of level detectors 54 and 58 are level signals $D_i$ 55 and $D_q$ 59, respectively. To briefly anticipate the subject matter of FIG. 6, a servo system is constructed that drives $Vc_i$ 50 and $Vc_q$ 51 to null out any difference between the level signals $D_i$ 55 and $D_q$ 59. Assuming that the level detectors 54 and 58 are of identical or very similar response (and assuming also the same of amplifiers 52, 53, 56, and 57), a difference of zero between the level signals $D_i$ 55 and $D_q$ 59 implies that each multiplier (41, 42) is supplied with local oscillator signals ($LO_i$ 39 and $LO_q$ 40, respectively) that are exactly in quadrature, of equal and of appropriate amplitude. (The "appropriateness" is the job of the transfer function in the limiting amplifiers.) Note also that with this arrangement the frequency dependent control signal 38 (of FIG. 3) / $Vc_i$ 50 and $Vc_q$ 51 (of FIG. 4) is produced without the need to explicitly know just what the frequency of the RF signal input (24, 8) is.

Before leaving FIG. 4 it should he noted that signal levels applied to the amplifiers 52, 53, 56 and 57 should be such that amplifiers 52 and 56 are never overdriven, and always operate in their linear region. This sets an upper limit. Likewise, there is a lower limit which is needed to ensure that amplifiers 53 and 57 actually do limit. These upper and lower limits translate backwards through the phase shift networks 48 and 49 to determine corresponding limits on the amount of drive the RF input signal 24 can have.

Figure 5A:
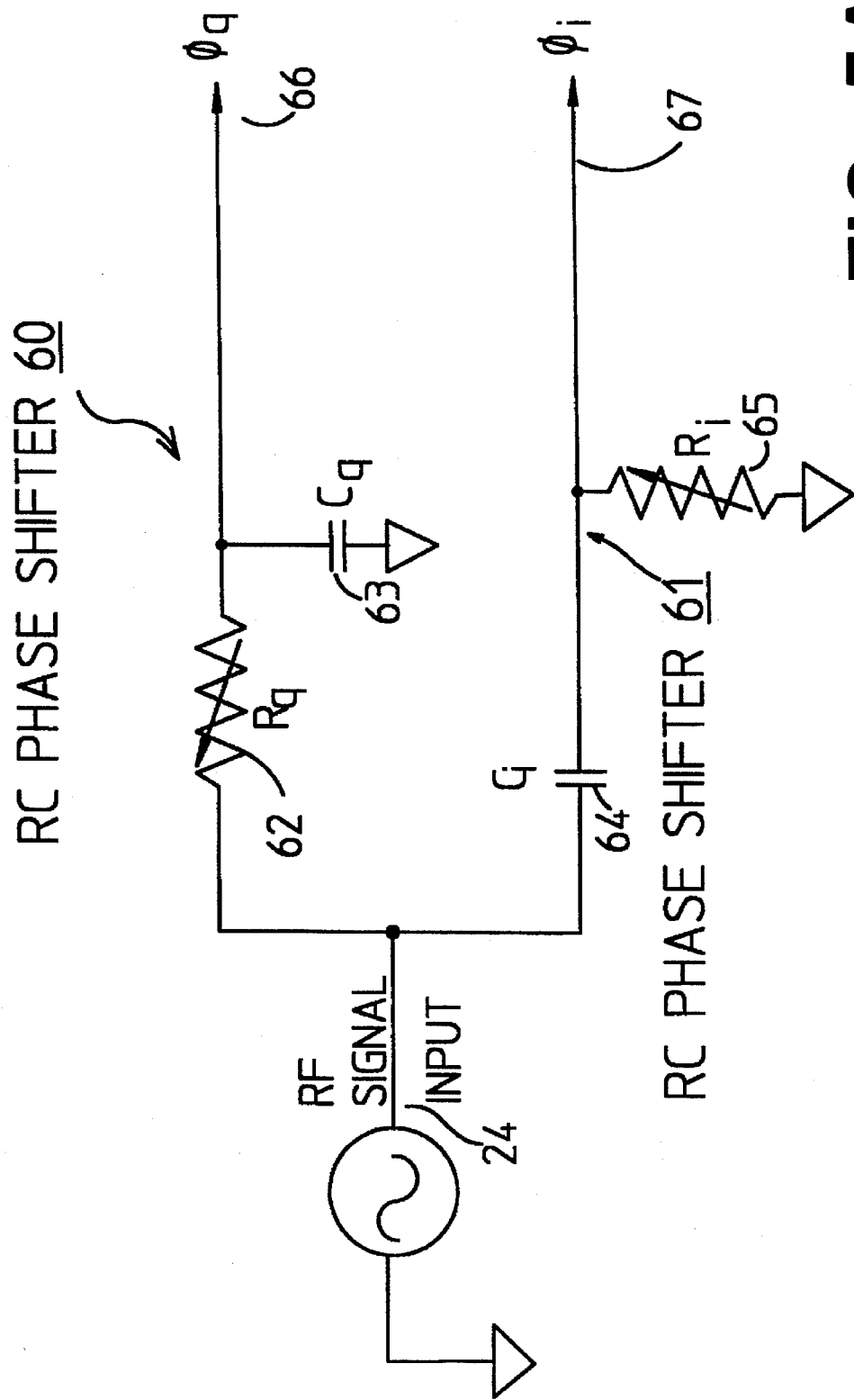
FIGS. 5A–5D are a simplified schematic diagram and associated bode plots illustrating a principle of operation incorporated in the phase shifters of FIG. 4.
Figure 5B:
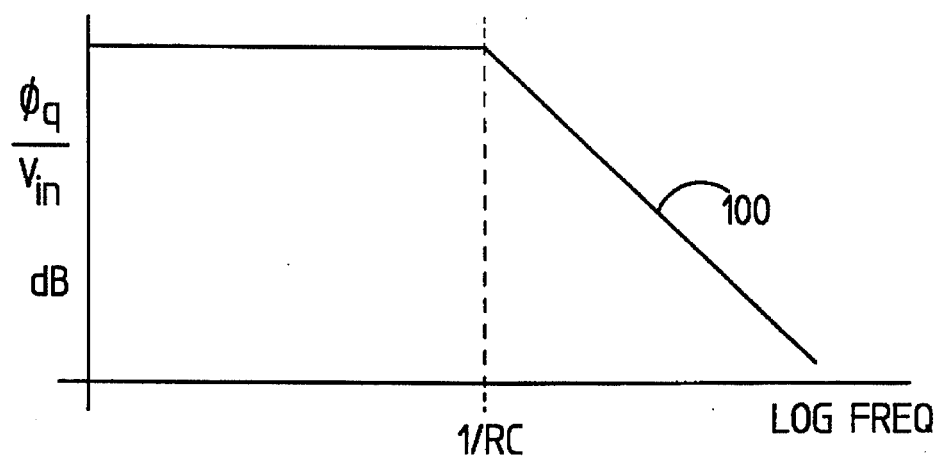
Figure 5C:
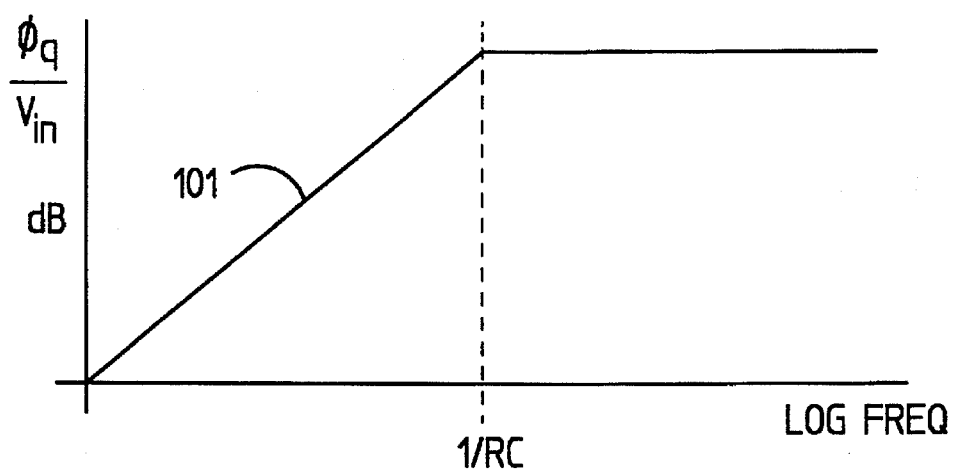

Refer now to FIGS. 5A–D, which are a simplified schematic diagram and associated bode plots illustrating the principle of operation of the phase shifters 48 and 49 (as depicted in FIG. 4). In FIG. 5A RC phase shifter 60 (49) comprises a variable resistance $R_q$ 62 driven by the RF input signal 24 and in series with a fixed capacitance to ground $C_q$ 63. The output signal from RC phase shifter 60 is $\phi_q$ 66, and is the voltage developed across $C_q$ 63. CR phase shifter 61 (48) comprises a fixed capacitance $C_i$ 64 driven by the RF input signal 24 and in series a variable resistance to ground $R_i$ 65. The output signal from CR phase shifter 61 is $\phi_i$ 67, and is the voltage developed across $R_i$ 65.

In a preferred embodiment the entire structure of FIG. 4 (which includes, of course, the topic presently under discussion in FIG. 5) is implemented on a single GaAs integrated circuit. As for $R_i$ 65 and $R_q$ 62, they are implemented as GaAs MESFET's of identical (or of very similar) geometry. (Good results are obtained with equal geometry, but a selected slight dissimilarity can produce even better results by compensating for error mechanisms that arise out of the non-ideal nature of an actual circuit.) They thus constitute equal resistances when driven by equal gate voltages. The capacitors $C_i$ 64 and $C_q$ 63 are likewise GaAs IC structures of identical geometry, and thus posses equal capacitance. The loads driven by $\phi_i$ 67 and $\phi_q$ 66 (i.e., the input impedances of linear amplifiers 56 and 52, respectively) are also identical.

Figure 5D:
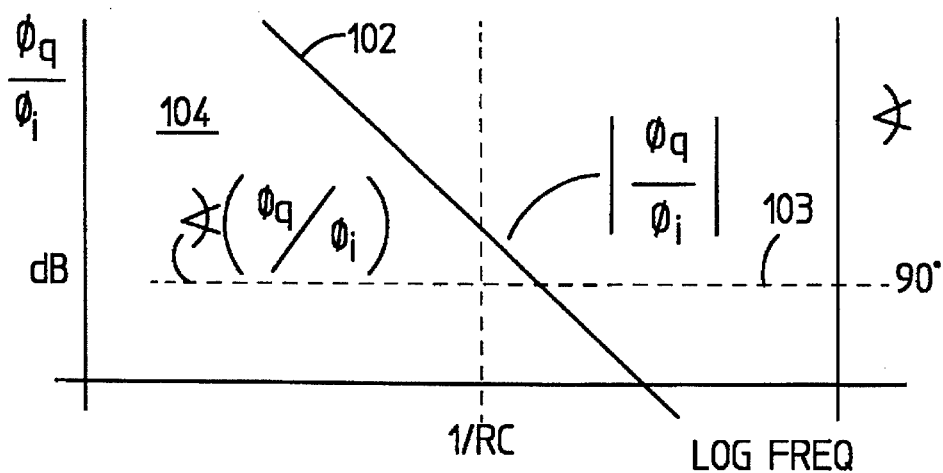

Given that the two capacitors $C_i$ 64 and $C_q$ 63 are of equal value, and that the two resistors $R_i$ 65 and $R_q$ 62 are of equal value, it can be shown, and it will be appreciated, that independent of frequency, the phase shift between $\phi_i$ 67 and $\phi_q$ 66 is ninety degrees, as shown by the graph 104 in FIG. 5D. This follows easily, since as networks each of the phase shifters 60 and 61 has the same impedance (R and C are commutative in a series RC network). Since each phase shifter is driven by the same signal and from a common source impedance, the currents within the phase shifters 60 and 61 are always equal and in phase. The voltage $\phi_i$ 67 across $R_i$ is in phase with the current through it. Because the voltage across a capacitor is always ninety degrees behind the current through the capacitor, $\phi_q$ 66 is ninety degrees behind $\phi_i$ 67. This works because the currents in the two phase shifters are identical, and the networks have commutative elements so that the two outputs can each be referenced to ground while being from across different portions of their respective networks. However, this does not ensure that the voltages $\phi_i$ 67 and $\phi_q$ 66 will be of equal amplitude. (It will be recalled that equal amplitude for those signals is important to prevent subsequent amplitude sensitive circuitry from producing spurious additional phase shift.)

For the voltages $\phi_i$ 67 and $\phi_q$ 66 to be of equal amplitude requires the additional condition that the resistances of $R_i$ 65 and $R_q$ 62 be equal to the reactances of capacitors $C_i$ 64 and $C_q$ 63. It will thus be appreciated, that for each different frequency it is necessary to (simultaneously and equally) adjust the values of the resistors $R_i$ and $R_q$ to produce equal amplitudes for signals $\phi_i$ and $\phi_q$. This can be achieved by driving the gates of the MESFET's with the same voltage, which is then varied until $\phi_i$ 67 equals $\phi_q$ 66. In the GaAs IC described toward the end of this Specification, $C_i$ and $C_q$ are each 1.0 pfd. This means that $R_i$ and $R_q$ need to vary over the range of about 50 to 800 ohms to accommodate a frequency range of from about 200 MHz to about 3 GHz.

The linear amplifiers (56, 52) and level detectors (54, 58) discussed in connection with FIG. 4 produce signals $D_i$ 55 and $D_q$ 59 whose amplitude difference is directly proportional to the amplitude difference between $\phi_i$ 67 and $\phi_q$ 66. A servo loop discussed below varies the MESFET gate voltages to null to zero the difference between the detected level signals $D_i$ 55 and $D_q$ 59. This also nulls the amplitude difference between $\phi_i$ 67 and $\phi_q$ 66. This makes the resistances $R_i$ and $R_q$ equal to each other as well as equal to the (equal) capacitive reactances $Xc_i$ and $Xc_q$, which in turn guarantees exact quadrature along with equal amplitudes.

It can also be shown that the loading of $\phi_i$ 67 and $\phi$66 by the input impedances of the linear amplifiers that are coupled thereto (56 and 52, respectively) does not disturb the equal phase/equal amplitude relationship described in the preceding paragraphs, provided that the input impedances of those amplifiers are equal.

Figure 6:
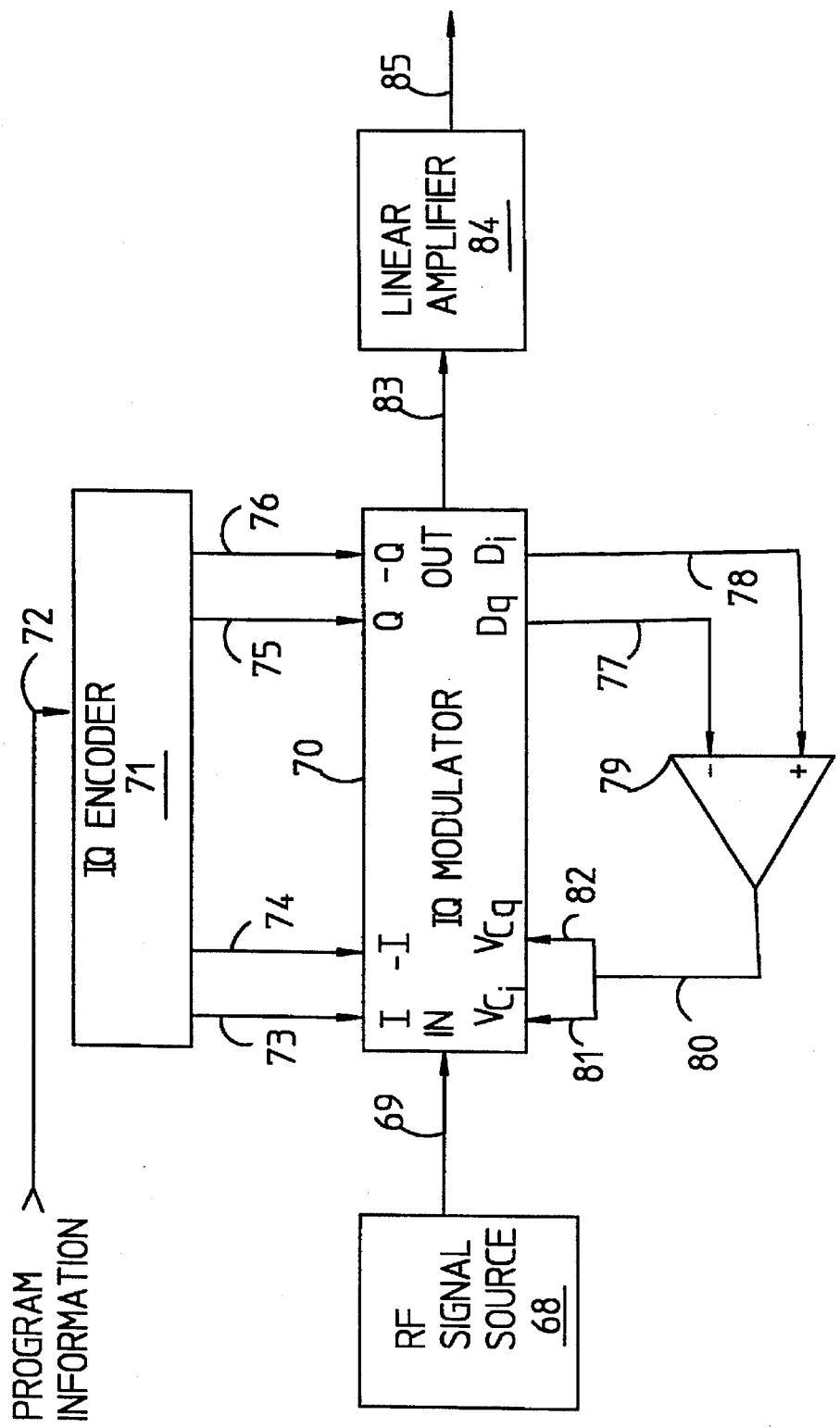
FIG. 6 is a simplified block diagram of the IQ modulator of FIG. 3 located in a larger operational environment and including a servo system for maintaining quadrature and equal amplitudes of the I and Q LO signals despite large changes in local oscillator frequency.

Refer now to FIG. 6 to appreciate how an IQ modulator responsive to a frequency dependent control signal is interconnected with other elements in a communication system. In the figure an RF signal source 68 produces an RF signal 69 which is coupled to an RF signal input terminal (IN) of an IQ modulator 70. In the instant embodiment the IQ modulator 70 is implemented as a single GaAs integrated circuit.

The IQ modulator integrated circuit 70 cooperates with an IQ encoder 71 that accepts as its input applied program information 72 and produces as its outputs "in phase" components I (73) and –I (74), as well as "quadrature" components Q (75) and –Q (76). Each of these pairs of signals is a differential pair balanced about some convenient reference, say, ground or some other predefined reference voltage. That is, if I and –I were added together in analog fashion, they would either sum to zero (reference is ground) or to some other (reference) voltage. Previously, we have not talked about I and –I, or Q and –Q, assuming instead that single ended unbalanced signals were sufficient. In principle they are, but in practice the type of multiplier preferred for use within the IQ modulator IC 70 uses balanced signals. Accordingly, a balanced signal +LO and –LO is internally derived from the RF signal input by differential amplifiers inside the IQ modulator IC 70.

Note that the signals $D_i$ 78 and $D_q$ 77 that represent the detected levels from the phase shifters are connected to the inputs of a difference (differential) amplifier 79. Its output 80 is coupled to two phase shifter control inputs $V_q$ 81 and $Vc_q$ 82. Difference amplifier 79 is a servo-controller that adjusts its output to minimize the difference between its input signals. Suppose the difference has been servoed to zero at some frequency, and that there is subsequently an increase in frequency. The capacitive reactances of $C_q$ and $C_i$ (see FIG. 5) now decrease, making $\phi_i$ greater in amplitude than $\phi_q$. Thus, $D_i$ increases in value and $D_q$ decreases in value, producing a difference that is no longer servoed to zero. This difference is amplified by difference amplifier 79. Assume that its output is an increase in a positive voltage, and that as a control voltage this turns the FET's in the IC on harder. Their resistance then decreases, and the servo loop converges once again toward an equilibrium where the resistances $R_i$ and $R_q$ equal the capacitive reactances of $C_i$ and $C_q$. The issues of loop gain and bandwidth need to be addressed in the context of their own particular servo loop. A principal limiting factor is the response time of the detectors used. In the preferred embodiment detector diodes 54 and 58 (in FIG. 4) are peak detectors relying upon either stray or deliberate capacitance to form a low pass filter. A time constant sufficient for a lowest frequency of, say, 100 MHz or 200 MHz, may produce compromises in the otherwise available servo loop response at 3 GHz. Servo loop response could be made a function of frequency, too, if desired.

The modulated output signal 83 that is produced by the IQ modulator IC 70 is coupled to a linear amplifier 84, whose output 85 is then used in whatever fashion is appropriate for the particular equipment at hand. For example, signal 85 may be applied to an antenna.

In FIG. 6 both control inputs $Vc_i$ 81 and $Vc_q$ 82 are shown as being driven by a single signal: output 80 from the difference amplifier 79. That is well and good, but there may be other instances where some particular advantage can be gained by allowing the two control signals $Vc_i$ 81 and $Vc_q$ 82 to have a slight difference between their values, and then control that slight difference for a particular result. For example, it might be desirable for operation at selected frequencies to establish slight offsets during a calibration sequence to produce especially good operation at those frequencies.

Figure 7:
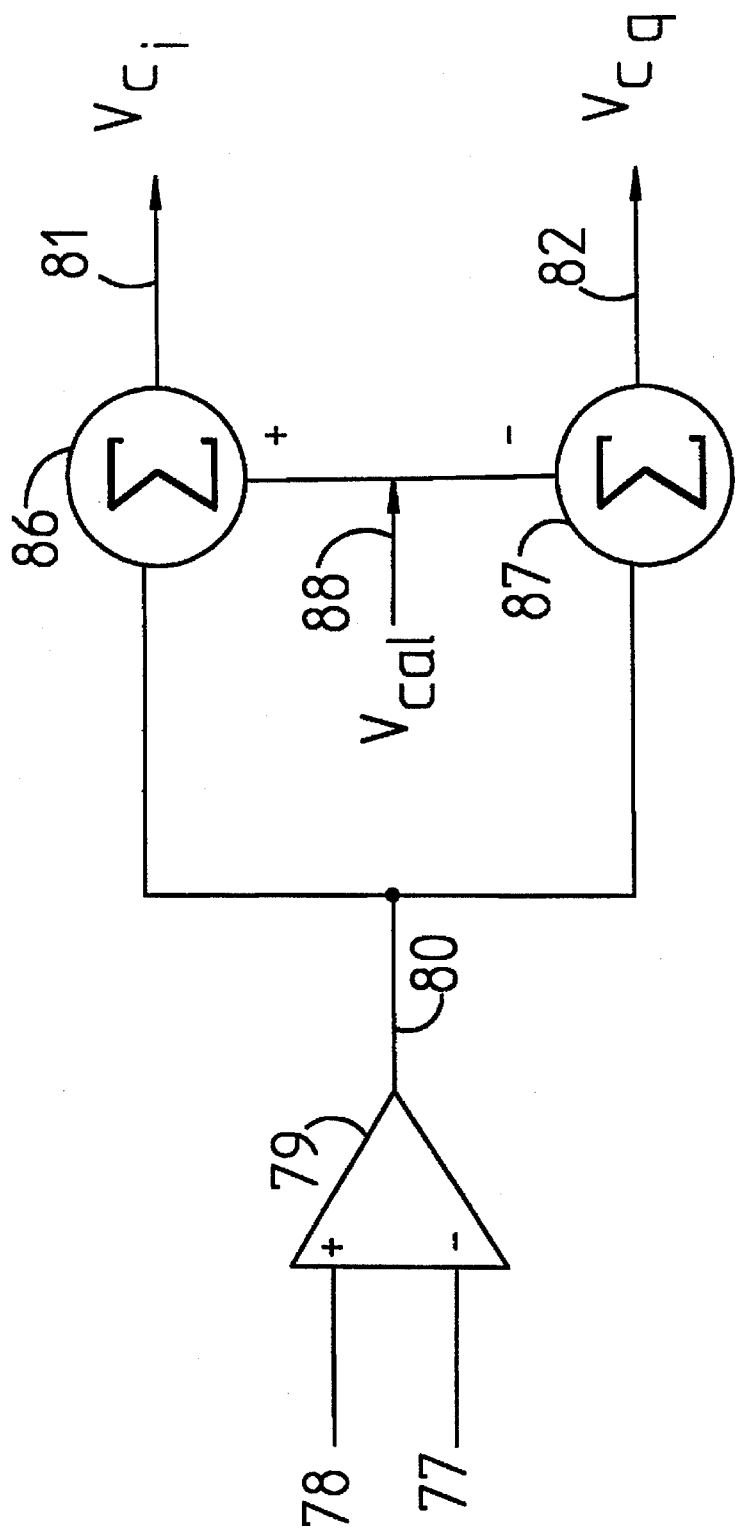
FIG. 7 is illustrates an improvement to the error amplifier in the servo system of FIG. 6.

An arrangement of that son is shown in FIG. 7. Difference amplifier 79 remains driven by signals 77 and 78, as before. Difference amplifier output 80, however, is applied to two summers 86 and 87. Each summer receives an offset voltage $V_{cal}$ 88. Note the arrangement with respect to polarity. $V_{cal}$ 88 is applied to the + input of summer 86 and to the − input of the other summer 87. The result is to add $V_{cal}$ to $Vc_i$ 81 and to subtract $V_{cal}$ from $Vc_q$ 82. It will be understood that $V_{cal}$ might be either plus or minus with respect to ground, as could the difference amplifier output 80. Also, the association of a "plus" summer 86 with $Vc_i$ and a "minus" summer 87 with $Vc_q$ is arbitrary.

It will further be appreciated that the source of the calibration offset voltage $V_{cal}$ 88 could be as simple as the wiper of a potentiometer across a fixed voltage, or as sophisticated as the output of a DAC (Digital to Analog Converter—not shown) driven by a ROM or RAM-based look-up table addressed by a frequency selector (also not shown).

Our discussions thus far have been either somewhat general or, if specific, somewhat simplified. This is effective in communicating the concept and its possibilities, but does not expressly set out the internal complexity of an actual GaAs IQ Modulator IC intended to function from around 200 MHz to over 3 GHz. We shall shortly begin a brief description of the actual complexity of such an IC. However, before doing so there are a few other topics collateral with the general ideas set out so far, and deserving of similar treatment. We cover them next since they are short, and since by so doing the balance of the disclosure can then be devoted exclusively to the actual complexity of the particular GaAs IC mentioned above.

The first collateral topic concerns whether or not an IQ modulator including a precision quadrature (phase shift) network responsive to a frequency dependent control signal needs to be implemented as an integrated circuit. Certainly at the high frequencies that is the only practical approach. However, for low frequency applications (say, below 50 MHZ or 100 MHz) circuits constructed of discrete components, or if integrated, employing certain off-chip bulk components, may be desirable. For example, for HF signals the amount of capacitance required may exceed the amount that can be provided by otherwise suitable IC processes. In such a case the entire circuit might be built of discrete components. Alternatively, the capacitors could be external to an otherwise complete IC.

The preferred integrated circuit described herein is one of GaAs with FET's. Silicon should not be dismissed, nor should the use of bipolar devices. It would all depend upon what is appropriate for the application at hand. Those factors would almost certainly include cost, and silicon parts that do provide the necessary electrical performance for a particular application may cost significantly less than GaAs!

Figure 8:
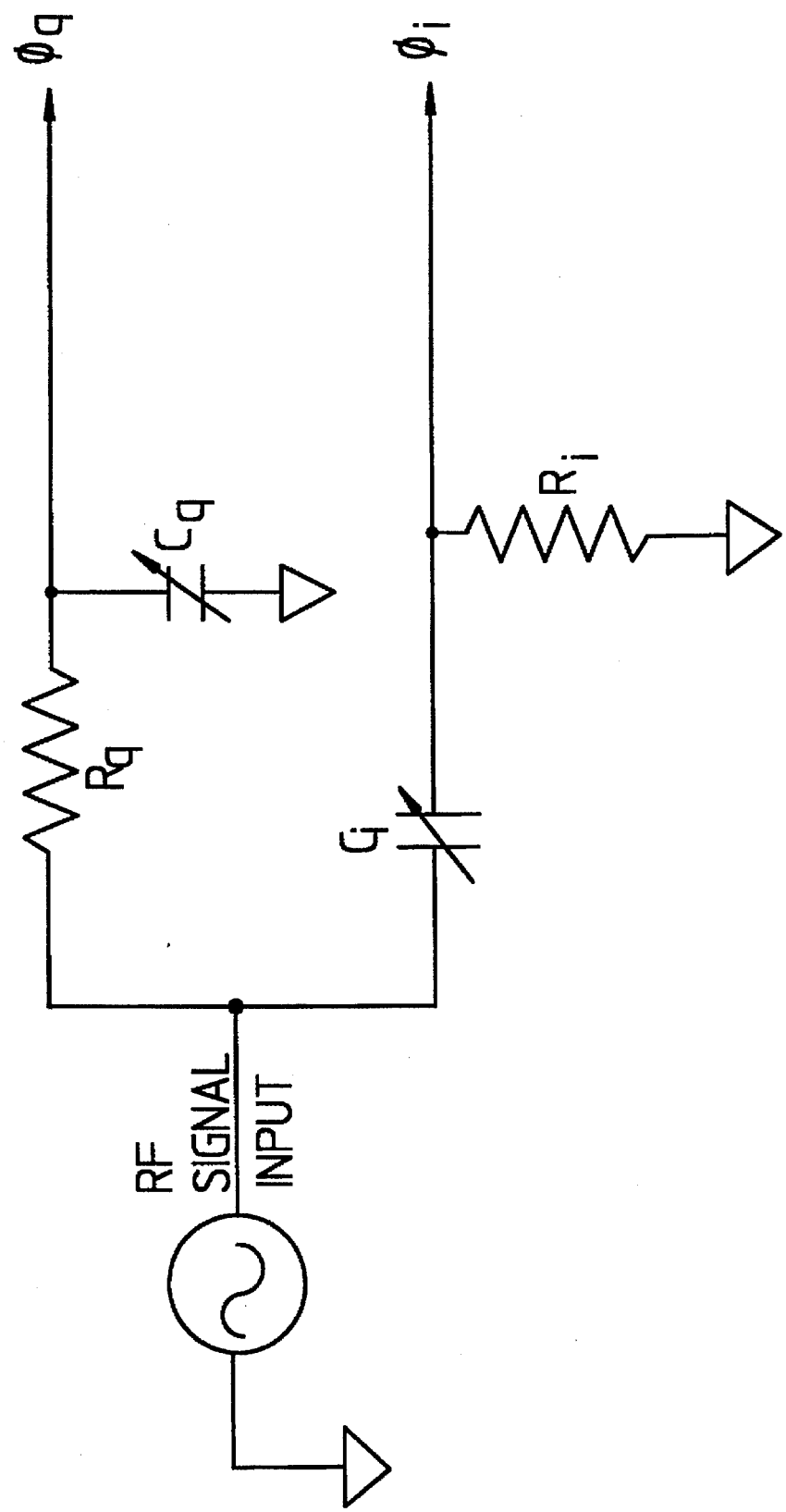
FIG. 8 is a simplified schematic diagram illustrating an alternate principle of operation that may be incorporated in the phase shifters of FIG. 4.
Figure 9A:
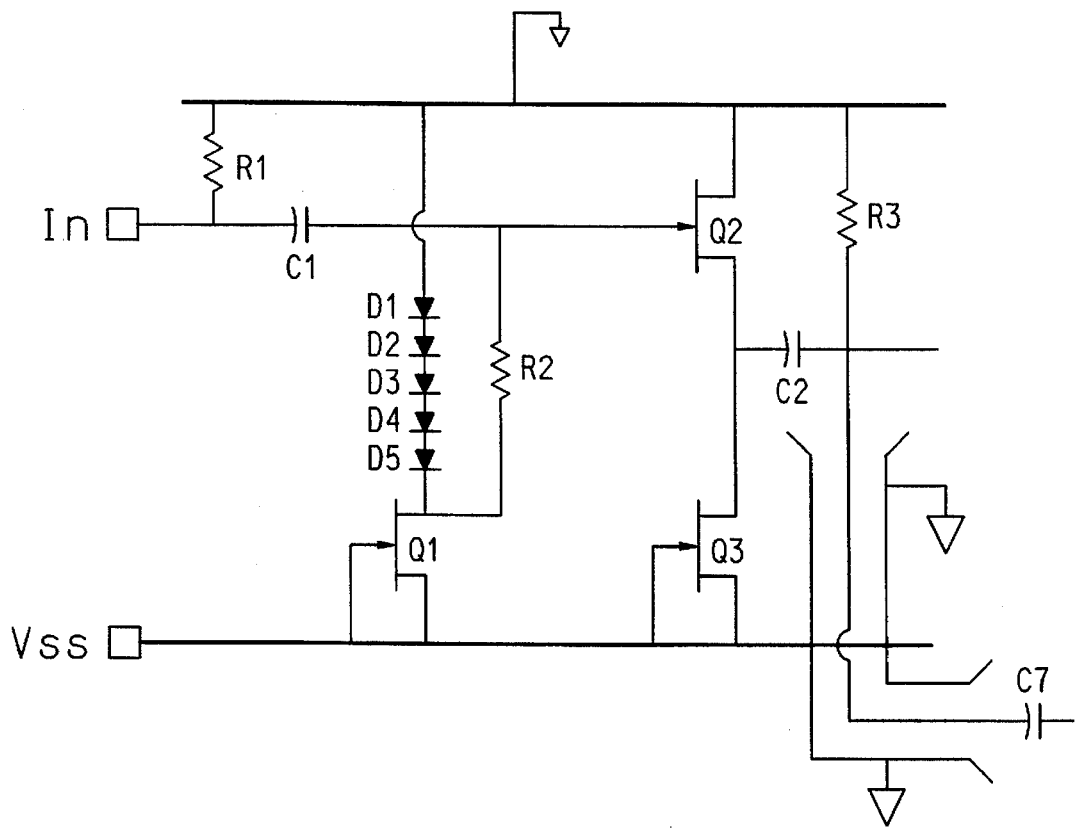
FIGS. 9A–9F are a schematic diagram of an actual circuit fabricated upon a GaAs wafer and that is an implementation of the block diagram of FIG. 4.
Figure 9B:
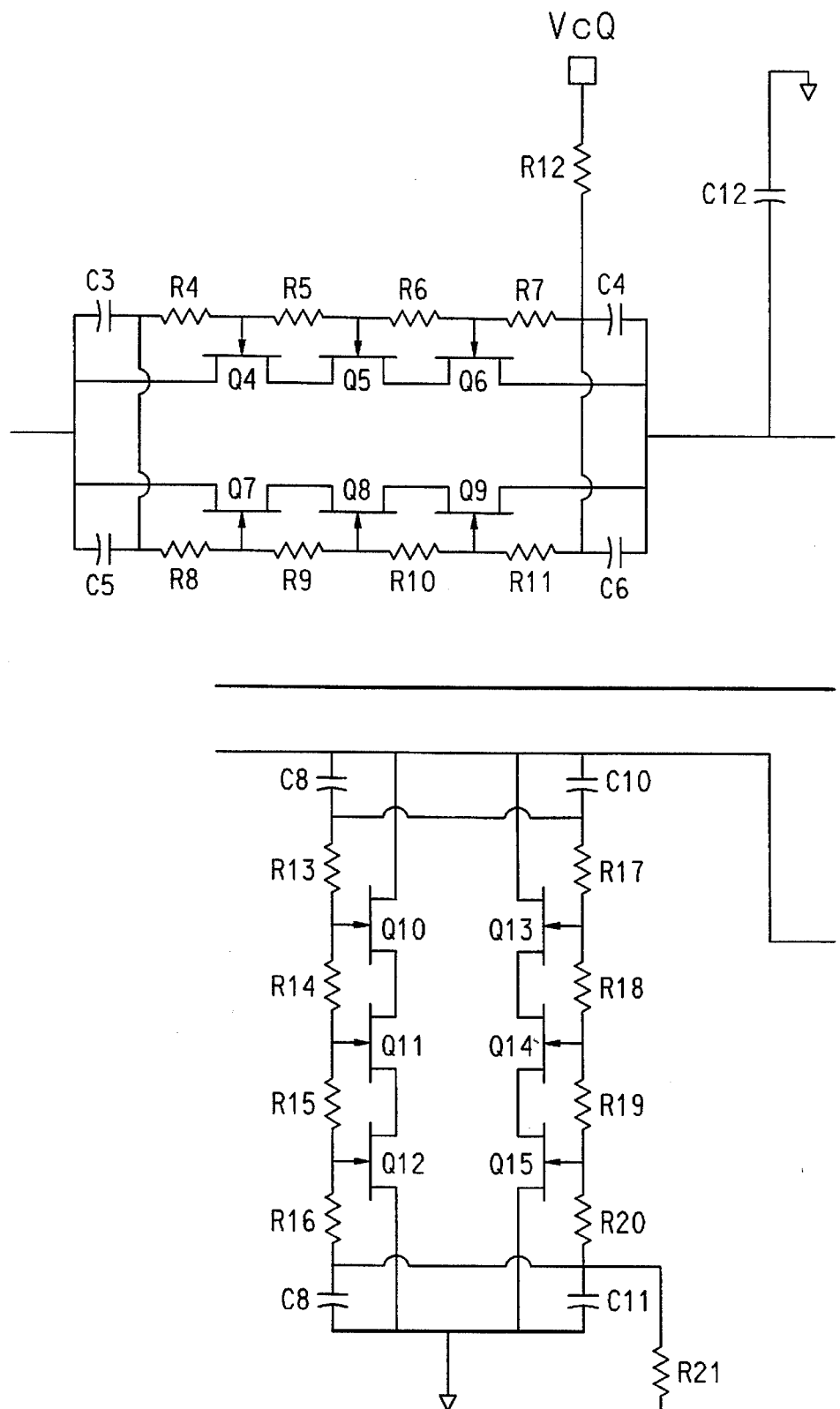
Figure 9C:
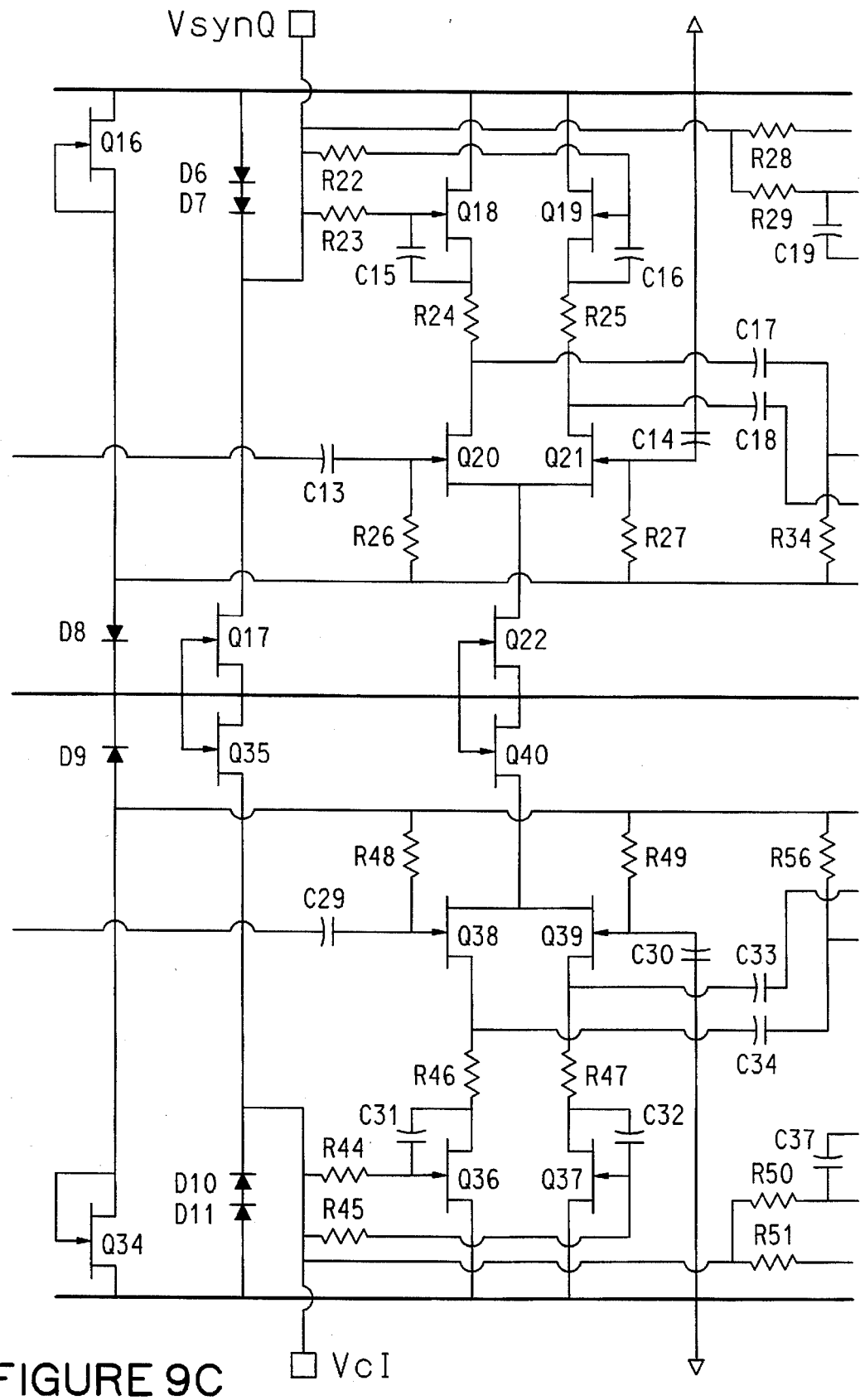
Figure 9D:
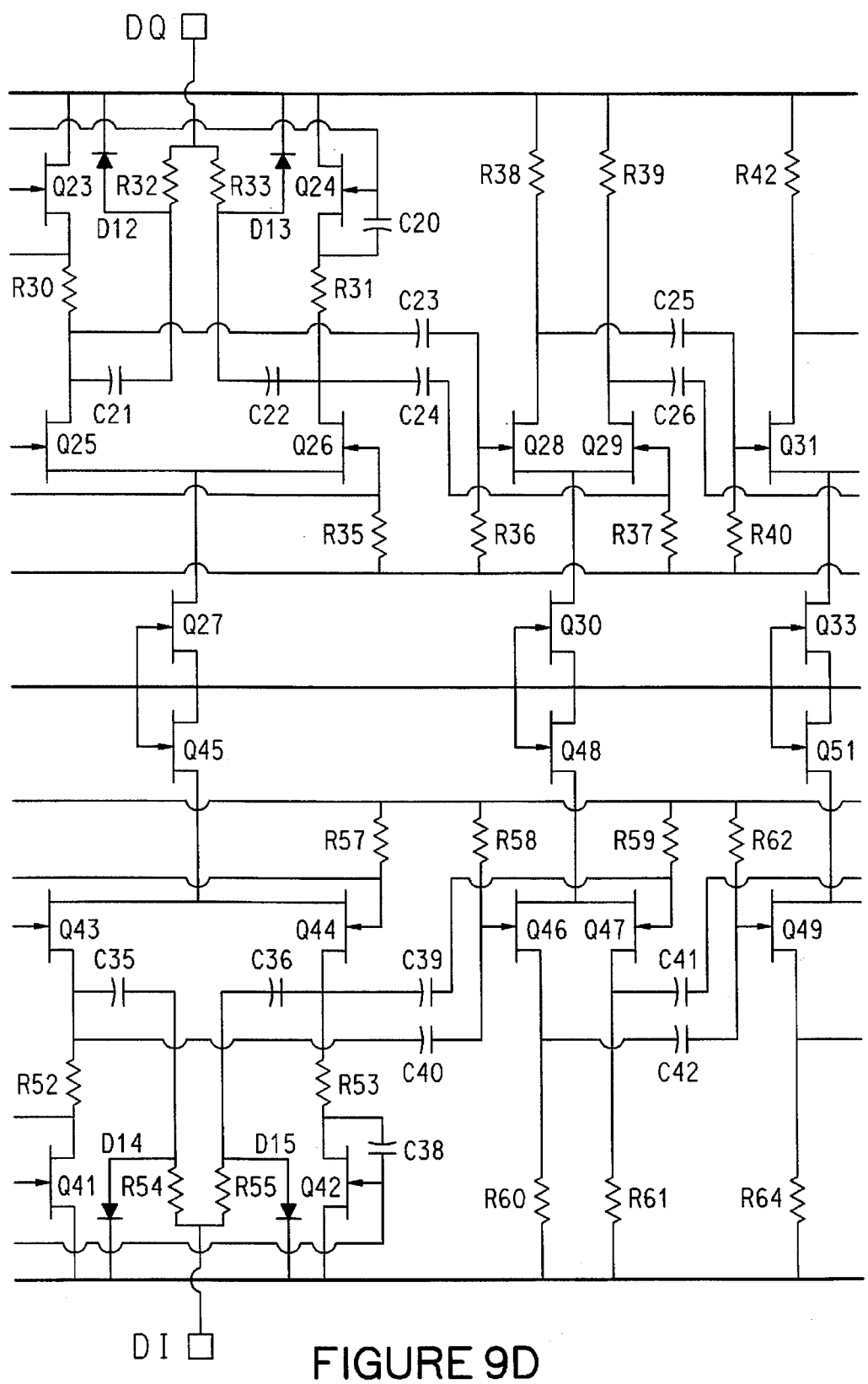
Figure 9E:
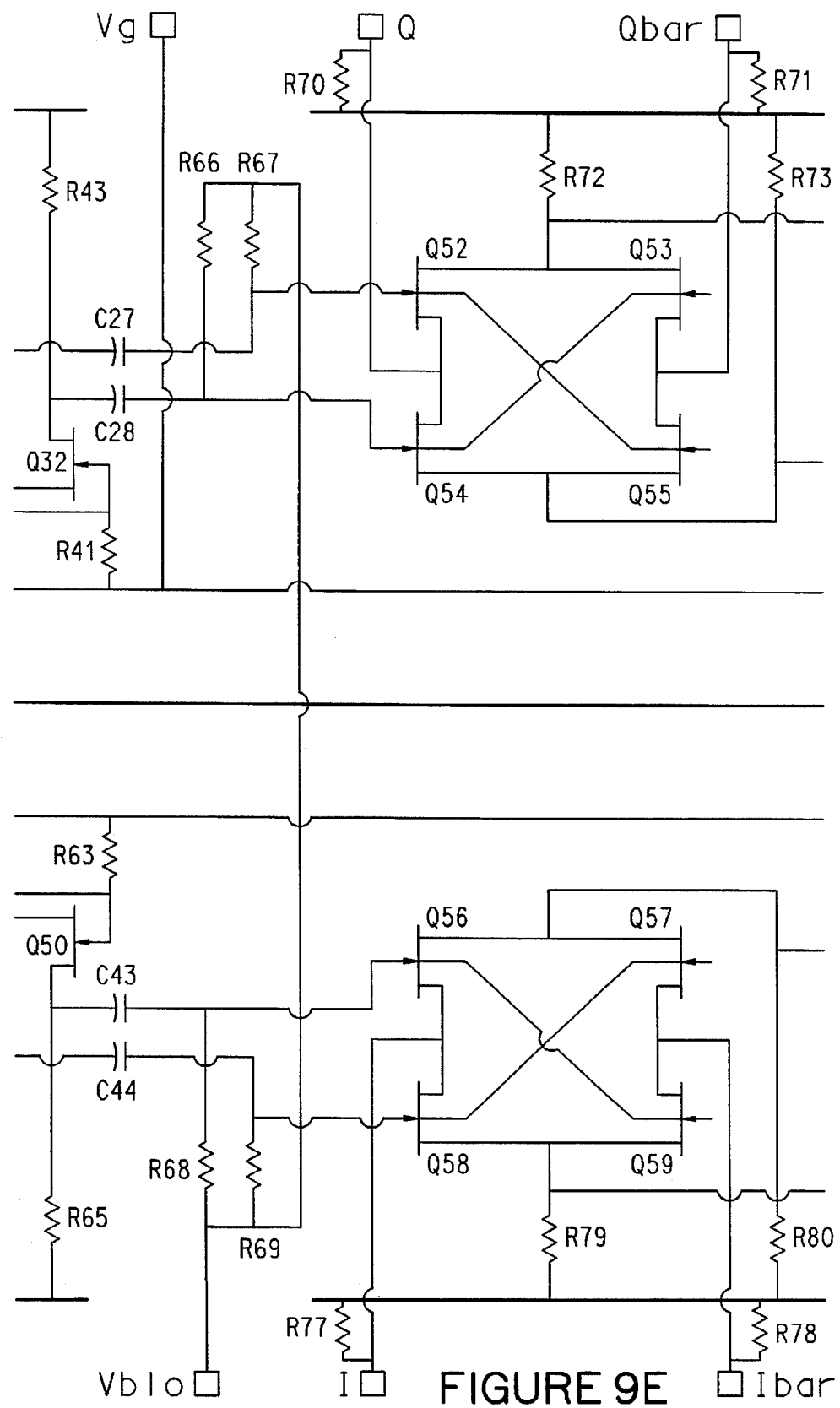
Figure 9F:
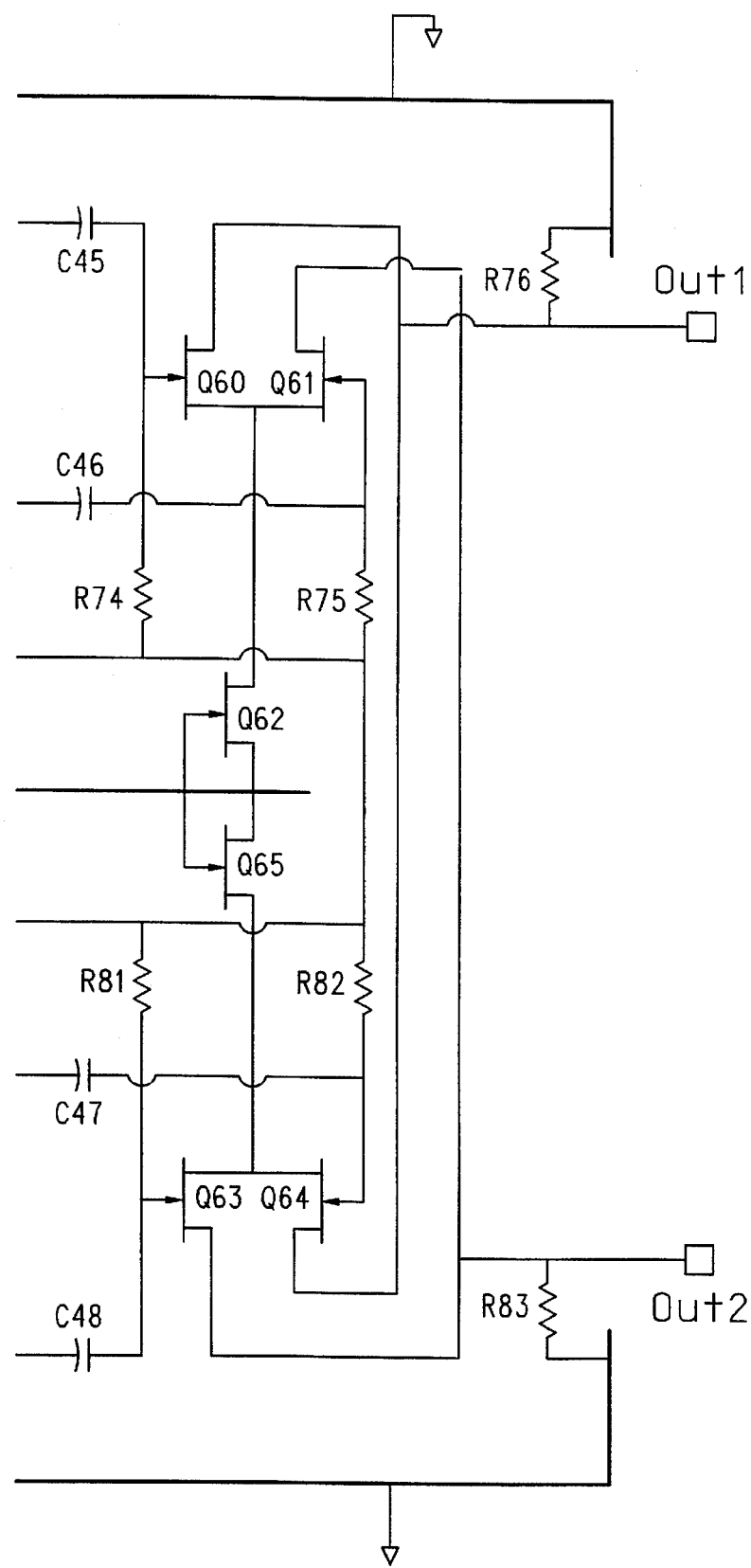

Finally, the phase shifter circuits 60 and 61 using fixed capacitances and variable resistances, as shown in FIG. 5, have counterparts shown in FIG. 8. As shown therein, the resistances are fixed and the capacitances are variable. Varactor diodes may be used to implement the variable capacitors.

Refer now to FIGS. 9A–F. Shown therein is the schematic for an actual IQ modulator incorporating a quadrature circuit having phase shifters responsive to a frequency dependent control signal and implemented as a GaAs IC.

The RF input signal is applied at the terminal marked In (corresponding to 69 of FIG. 6), and is applied to a source follower $Q_2$. The output of the source follower $Q_2$ is capacitively coupled by $C_2$ to an RC phase shifter and to a CR phase shifter. The "R" ($R_q$ 62 in FIG. 5) in the RC phase shifter (49 in FIG. 4) comprises the six transistors $Q_{4-9}$; the "C" is $C_{12}$ ($C_q$ 63 of FIG. 5). The terminal marked VcQ corresponds to the frequency dependent control signal $Vc_q$ 51 of FIG. 4. In similar fashion, $C_7$ is the "C" ($C_i$ 64 of FIG. 5) of the CR phase shifter (48 of FIG. 4); the "R" is comprised of the six transistors $Q_{10-15}$ ($R_i$ 65 of FIG. 5). The terminal marked VcI corresponds to the frequency dependent control signal $Vc_i$ 50 of FIG. 4. A length of (microstrip) transmission line between the output of the source follower $Q_2$ and $C_7$ increases the phase difference between the I and Q channels (the lower and upper "halves" of the schematic, respectively) at higher frequencies to compensate for the parasitic capacitances of the FET's used as $R_i$ and $R_q$. Those parasitic capacitances otherwise reduce the phase difference between the two channels to less than ninety degrees at high frequencies.

In the Q channel $C_{13}$ is the input to the (Q) linear amplifier 52 of FIG. 4. Note that the linear amplifier performs a single-ended to differential conversion. Capacitors $C_{21}$ and $C_{22}$ drive (Q) detector diodes $D_{12}$ and $D_{13}$, which correspond to detector diode 58 in FIG. 4. $C_{23}$ and $C_{24}$ couple the output of the (Q) linear amplifier to the (Q) limiting amplifier (53 of FIG. 4). The output of the (Q) limiting amplifier is coupled by $C_{27}$ and $C_{28}$ to the Q mixer (41 of FIG. 4). The Q mixer is a ring mixer comprised of the four unbiased FET's $Q_{52-55}$.

In the I channel $C_{29}$ is the input to the (I) linear amplifier 56 of FIG. 4. Capacitors $C_{35}$ and $C_{36}$ drive (I) detector diodes $D_{14}$ and $D_{15}$, which correspond to detector diode 54 in FIG. 4. $C_{39}$ and $C_{40}$ couple the output of the (I) linear amplifier to the (I) limiting amplifier (57 of FIG. 4). The output of the (I) limiting amplifier is coupled by $C_{43}$ and $C_{44}$ to the I mixer (42 of FIG. 4). The I mixer is a ring mixer comprised of the four unbiased FET's $Q_{56-59}$.

The use of unbiased FET's as ring mixers reduces upconversion of 1/f noise. The output of the Q mixer is coupled by $C_{45}$ and $C_{46}$ to a summer comprised of transistors $Q_{60-65}$. The output of the I mixer is similarly coupled to the summer by $C_{47}$ and $C_{48}$. Note that the configuration of the summer affords isolation between the I and Q mixers; this reduces intermodulation. The outputs Out1 and Out2 comprise a balanced signal corresponding to output 83 of FIG. 6.

The input source follower $Q_2$ provides the high frequency response and low source impedance needed for supplying the high current required to drive the heavy capacitive loading of the RC and CR phase shifters. Various symmetries in the physical layout of the IC chip help reach the goal of providing drive signals of known phase and equal amplitudes to the I and Q mixers. For example, the "R's" of the RC and CR phase shifters are each six transistors. Each R is arranged as two parallel columns of three transistors. The associated capacitor is placed between the parallel columns, and interconnected as appropriate. This placement minimizes the asymmetry caused by the RC and CR networks being slightly different concerning which element is grounded and which element is driven. There is also a maximum of symmetry in the physical layout between the I and Q channels (which are essentially the upper and lower halves, running from inputs on the left to outputs on the right). The I and Q channels are as identical as possible.

The center of the chip contains I and Q channels of four-stage differential amplification. For compactness of layout and to maximize common mode rejection at the last stage, the outermost left and fight transistors are the input differential pair, with succeeding pairs (stages) in progressively closer proximity until the final output pair abut. Termination resistances are employed where appropriate throughout the entire circuit of the IC as a hedge against evil.

The starting material of the IC is gallium arsenide (GaAs) having a 0.2 micron thick top layer doped with $2 \times 10^{17}$ Si atoms per cubic centimeter. The substrate dielectric constant is 12.9, and the substrate thickness is one hundred microns. The transistors are Metal-Semiconductor Field Effect Transistors (MESFET's) with 0.45 micron gates and with a transition frequency of 23 GHz. The integrated circuit has ten masks; each of the ten masks corresponds to a layer of, or to a process applied to, the IC. There follows now a description of each of the layers:

Layer 1: A mask defining an ohmic contact layer. A gold-germanium nickel alloy provides two-way electrical contact to the conducting GaAs surface.

Layer 2: A mask defining an isolation layer. A proton implantation eliminates electrical conductivity outside of the isolated areas. This layer also defines the active regions of transistors and implanted resistors.

Layer 3: A mask defining a tantalum nitride resistor layer.

Layer 4: A mask defining a titanium-platinum-gold gate metal layer. Controls transistor current and provides some interconnectivity. Also serves as anodes for Schottky barrier diodes.

Layer 5: A mask defining a titanium-platinum-gold bottom plate layer for metal-insulator-metal capacitors. (The insulator is one thousand angstroms of silicon nitride.)

Layer 6: A mask defining a titanium top plate layer for the metal-insulator-metal capacitors.

Layer 7: A mask defining a via layer for openings made through the dielectric coatings to allow contact to be made between the second metal layer 8 and layers 1, 4, 5 and 6.

Layer 8: A mask defining a two micron thick titanium-platinum-gold second metal interconnect layer.

Layer 9: A mask defining openings in a polymide dielectric protection coating for access to bonding pads defined in layer 8, and also for the removal of dielectric material above transistors to reduce parasitic capacitance.

Layer 10: A mask defining a backside via layer through the GaAs substrate for low impedance connections to a ground potential.

With reference once again to FIGS. 9A–F, and in light of the process by which the IC is fabricated, here now is a parts list of the components identified by the component designators in FIG. 9A–F.

| TRANSISTORS | GATE WIDTH IN MICRONS | TRANSISTORS | GATE WIDTH IN MICRONS |
|---|---|---|---|
| Q1 | 20 | Q34 | 17 |
| Q2 | 450 | Q35 | 20 |
| Q3 | 150 | Q36 | 35 |
| Q4 | 110 | Q37 | 35 |
| Q5 | 110 | Q38 | 100 |
| Q6 | 110 | Q39 | 100 |
| Q7 | 110 | Q40 | 55 |
| Q8 | 110 | Q41 | 35 |
| Q9 | 110 | Q42 | 35 |
| Q10 | 110 | Q43 | 100 |
| Q11 | 110 | Q44 | 100 |
| Q12 | 110 | Q45 | 55 |
| Q13 | 110 | Q46 | 100 |
| Q14 | 110 | Q47 | 100 |
| Q15 | 110 | Q48 | 55 |
| Q16 | 17 | Q49 | 100 |
| Q17 | 20 | Q50 | 100 |
| Q18 | 35 | Q51 | 55 |
| Q19 | 35 | Q52 | 100 |
| Q20 | 100 | Q53 | 100 |
| Q21 | 100 | Q54 | 100 |
| Q22 | 55 | Q55 | 100 |
| Q23 | 35 | Q56 | 100 |
| Q24 | 35 | Q57 | 100 |
| Q25 | 100 | Q58 | 100 |
| Q26 | 100 | Q59 | 100 |
| Q27 | 55 | Q60 | 200 |
| Q28 | 100 | Q61 | 200 |
| Q29 | 100 | Q62 | 110 |
| Q30 | 55 | Q63 | 200 |
| Q31 | 100 | Q64 | 200 |
| Q32 | 100 | Q65 | 110 |
| Q33 | 55 | | |

NOTE: ALL TRANSISTOR GATE LENGTHS ARE 0.45 MICRONS

| DIODES | DIODE PERIPHERY IN MICRONS | DIODES | DIODE PERIPHERY IN MICRONS |
|---|---|---|---|
| D1 | 80 | D9 | 80 |
| D2 | 80 | D10 | 80 |
| D3 | 80 | D11 | 80 |
| D4 | 80 | D12 | 10 |
| D5 | 80 | D13 | 10 |
| D6 | 80 | D14 | 10 |
| D7 | 80 | D15 | 10 |
| D8 | 80 | | |

| RESISTORS | OHMS | RESISTORS | OHMS | RESISTORS | OHMS |
|---|---|---|---|---|---|
| R1 | 50 | R29 | 900 | R57 | 2.0K |
| R2 | 2.0K | R30 | 60 | R58 | 2.0K |
| R3 | 3.3K | R31 | 60 | R59 | 2.0K |
| R4 | 1.0K | R32 | 5.0K | R60 | 200 |
| R5 | 2.0K | R33 | 5.0K | R61 | 200 |
| R6 | 2.0K | R34 | 2.0K | R62 | 2.0K |
| R7 | 1.0K | R35 | 2.0K | R63 | 2.0K |
| R8 | 1.0K | R36 | 2.0K | R64 | 200 |
| R9 | 2.0K | R37 | 2.0K | R65 | 200 |
| R10 | 2.0K | R38 | 200 | R66 | 2.0K |
| R11 | 1.0K | R39 | 200 | R67 | 2.0K |
| R12 | 5.0K | R40 | 2.0K | R68 | 2.0K |
| R13 | 1.0K | R41 | 2.0K | R69 | 2.0K |
| R14 | 2.0K | R42 | 200 | R70 | 50 |
| R15 | 2.0K | R43 | 200 | R71 | 50 |
| R16 | 1.0K | R44 | 900 | R72 | 600 |
| R17 | 1.0K | R45 | 900 | R73 | 600 |
| R18 | 2.0K | R46 | 60 | R74 | 2.0K |
| R19 | 2.0K | R47 | 60 | R75 | 2.0K |
| R20 | 1.0K | R48 | 2.0K | R76 | 50 |
| R21 | 5.0K | R49 | 2.0K | R77 | 50 |
| R22 | 900 | R50 | 900 | R78 | 50 |
| R23 | 900 | R51 | 900 | R79 | 600 |
| R24 | 60 | R52 | 60 | R80 | 600 |
| R25 | 60 | R53 | 60 | R81 | 2.0K |
| R26 | 2.0K | R54 | 5.0K | R82 | 2.0K |
| R27 | 2.0K | R55 | 5.0K | R83 | 50 |
| R28 | 900 | R56 | 2.0K | | |

| CAPACI-TORS | pFd | CAPACI-TORS | pFd | CAPACI-TORS | pFd |
| --- | --- | --- | --- | --- | --- |
| C1 | 3.0 | C17 | 1.8 | C33 | 1.8 |
| C2 | 3.4 | C18 | 1.8 | C34 | 1.8 |
| C3 | 1.2 | C19 | .06 | C35 | .06 |
| C4 | 1.2 | C20 | .06 | C36 | .06 |
| C5 | 1.2 | C21 | .044 | C37 | .044 |
| C6 | 1.2 | C22 | .044 | C38 | .044 |
| C7 | 1.0 | C23 | 2.1 | C39 | 2.1 |
| C8 | 1.2 | C24 | 2.1 | C40 | 2.1 |
| C9 | 1.2 | C25 | 1.6 | C41 | 1.6 |
| C10 | 1.2 | C26 | 1.6 | C42 | 1.6 |
| C11 | 1.2 | C27 | 1.6 | C43 | 1.6 |
| C12 | 1.0 | C28 | 1.6 | C44 | 1.6 |
| C13 | 1.9 | C29 | 1.9 | C45 | 1.7 |
| C14 | 1.9 | C30 | 1.9 | C46 | 1.7 |
| C15 | .06 | C31 | .06 | C47 | 1.7 |
| C16 | .06 | C32 | .06 | C48 | 1.7 |

The microstrip transmission line is 5 microns in width and 345 microns in length.

We claim:

1. A phase shift circuit comprising:

a first phase shifter having a first input that receives an input signal to be phase shifted, a first output at which appears a phase shifted first output signal having an amplitude that is related to the phase difference between the input signal and the first output signal, and a first control input that receives a first control signal to which the first phase shifter is responsive by varying the phase shift between the input signal and the first output signal;

a second phase shifter having a second input that receives the input signal, a second output at which appears a phase shifted second output signal having an amplitude that is related to the phase difference between the input signal and the second output signal, and a second control input that receives a second control signal to which the second phase shifter is responsive by varying the phase shift between the input signal and the second output signal;

a first amplitude detector, coupled to the first output signal, that produces a first level signal corresponding to the amplitude of the first output signal;

a second amplitude detector, coupled to the second output signal, that produces a second level signal corresponding to the amplitude of the second output signal;

a differential amplifier having inputs coupled to the first and second level signals and having an output; and a circuit coupled to the output of the differential amplifier and having outputs coupled to the first and second control inputs, the circuit introducing a differential offset between the first and second control signals.

2. A phase shift circuit as in claim 1 wherein:

the first phase shifter further comprises a first variable resistance in series with a first capacitance to a signal ground, the first control signal determines the resistance of the first variable resistance, and the first output signal is the voltage across the first capacitance; and the second phase shifter further comprises a second capacitance in series with a second variable resistance to the signal ground, the second control signal determines the resistance of the second variable resistance, and the second output signal is the voltage across the second variable resistance.

3. A phase shift circuit as in claim 2 wherein the first and second capacitances are of equal value.

4. A phase shift circuit as in claim 3 wherein the first and second variable resistances are FET's exhibiting equal resistances whenever the first and second control signals are equal, and wherein the first and second output signals are in quadrature.

5. A phase shift circuit as in claim 1 wherein:

the first phase shifter further comprises a first variable capacitance in series with a first resistance to a signal ground, the first control signal determines the capacitance of the first variable capacitance, and the first output signal is the voltage across the first resistance; and the second phase shifter further comprises a second resistance in series with a second variable capacitance to the signal ground, the second control signal determines the capacitance of the second variable capacitance, and the second output signal is the voltage across the second variable capacitance.

6. A phase shift circuit as in claim 5 wherein the first and second resistances are of equal value.

7. A phase shift circuit as in claim 6 wherein the first and second variable capacitances are varactor diodes exhibiting equal capacitances whenever the first and second control signals are equal, and wherein the first and second output signals are in quadrature.

* * * * *